(12) United States Patent
Luich

(10) Patent No.: US 8,350,634 B2
(45) Date of Patent: Jan. 8, 2013

(54) VCO WITH INDEPENDENTLY CONTROLLABLE PARAMETERS

(75) Inventor: Thomas M. Luich, Puyallup, WA (US)

(73) Assignee: Glacier Microelectronics, Santa Clara, CA (US)

( * ) Notice: Subject to any disclaimer, the term of this patent is extended or adjusted under 35 U.S.C. 154(b) by 719 days.

(21) Appl. No.: 11/516,935

(22) Filed: Sep. 6, 2006

(65) Prior Publication Data

US 2008/0068092 A1    Mar. 20, 2008

(51) Int. Cl.
*H03B 5/08*    (2006.01)

(52) U.S. Cl. ......... 331/167; 331/177 V; 331/16; 331/34; 331/177 R (58) Field of Classification Search .............. 331/177 V, 331/34, 177 R, 16, 167, 117 R, 117 FE
See application file for complete search history.

(56) References Cited

U.S. PATENT DOCUMENTS

| | | | | |
|---|---|---|---|---|
| 6,900,675 | B2 * | 5/2005 | Briones | 327/147 |
| 7,006,589 | B2 * | 2/2006 | Staszewski et al. | 375/371 |
| 7,358,823 | B2 * | 4/2008 | Abadeer et al. | 331/177 V |
| 7,474,166 | B2 * | 1/2009 | Tanaka | 331/177 V |

* cited by examiner

*Primary Examiner* — Arnold Kinkead
(74) *Attorney, Agent, or Firm* — Useful Arts IP (57) ABSTRACT

This disclosure relates to a programmable wideband, LC Tuned, Voltage Controlled Oscillator with continuous center frequency select, and independent configuration of amplitude and tuning gain. The programmability can be via on chip non-volatile memory, or through data shifted into the part and stored via a data bus.

18 Claims, 7 Drawing Sheets

FIG. 3
Vco Frequency & Tuning Gain For LC Tuned Oscillator with Fixed Varactor

FIG. 5
Block Level of Programmable Wideband LC VCO

FIG. 6

FIG. 7  VCO Gm Stage

VCO WITH INDEPENDENTLY CONTROLLABLE PARAMETERS

BACKGROUND OF THE INVENTION

1. Field of the Invention

The present invention relates to voltage controlled oscillators (VCOs), particularly wideband VCOs.

2. State of the Art

Figure 1:
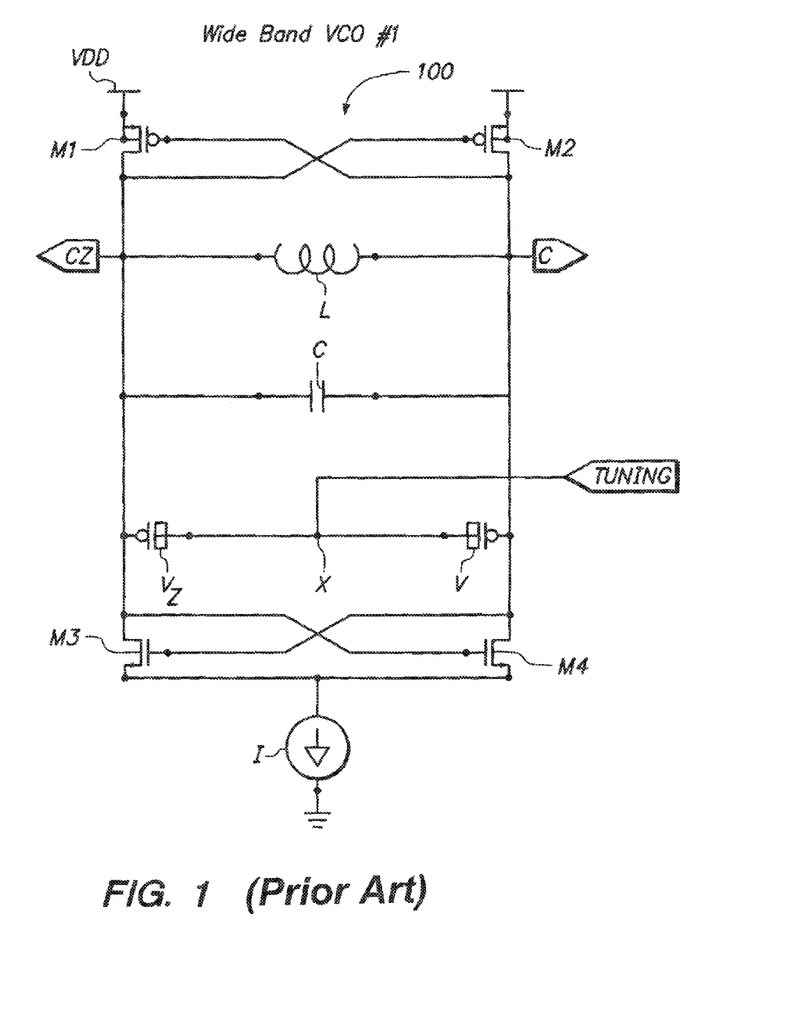
FIG. 1 is a circuit diagram of one prior art VCO.

FIG. 1 shows typical complementary LC tuned VCO 100 with a single tuning port configured for wideband operation. A complementary cross coupled CMOS inverter is formed by PMOS transistors M1, M2 and NMOS transistors M3, M4. The PMOS transistors are cross coupled such that a gate electrode of each is coupled to a drain electrode of the opposite PMOS transistor. Similarly, the NMOS transistors are cross coupled such that a gate electrode of each is connected to a drain electrode of the opposite NMOS transistor. The PMOS transistor M1 and the NMOS transistor M3 are coupled drain to drain, and the PMOS transistor M2 and the NMOS transistor M4 are coupled drain to drain. Source electrodes of the PMOS transistors are connected to a supply voltage VDD. Source electrodes of the NMOS transistors are connected through a tail current source I to ground. Complementary output signals are formed between the PMOS transistor M2 and the NMOS transistor M4, on the one hand (output terminal C), and between the PMOS transistor M1 and the NMOS transistor M3, on the other hand (output terminal CZ). Coupled between the output terminals are frequency controlling reactive elements including an inductor L, a capacitor C and varactors V and $V_z$. A tuning input signal (TUNING) is connected to control terminals of the varactors at node X.

Wide band tuning implies high tuning gain which is undesirable for noise considerations, as may be appreciated from the following example. For a VCO to cover the range from 800 MHz to 1700 MHz, at 3V operation, the tuning gain will be 300 MHz/V. In this instance, 1 mv of noise on the tuning node will translate to 300 kHz of frequency deviation (phase noise).

Figure 2:
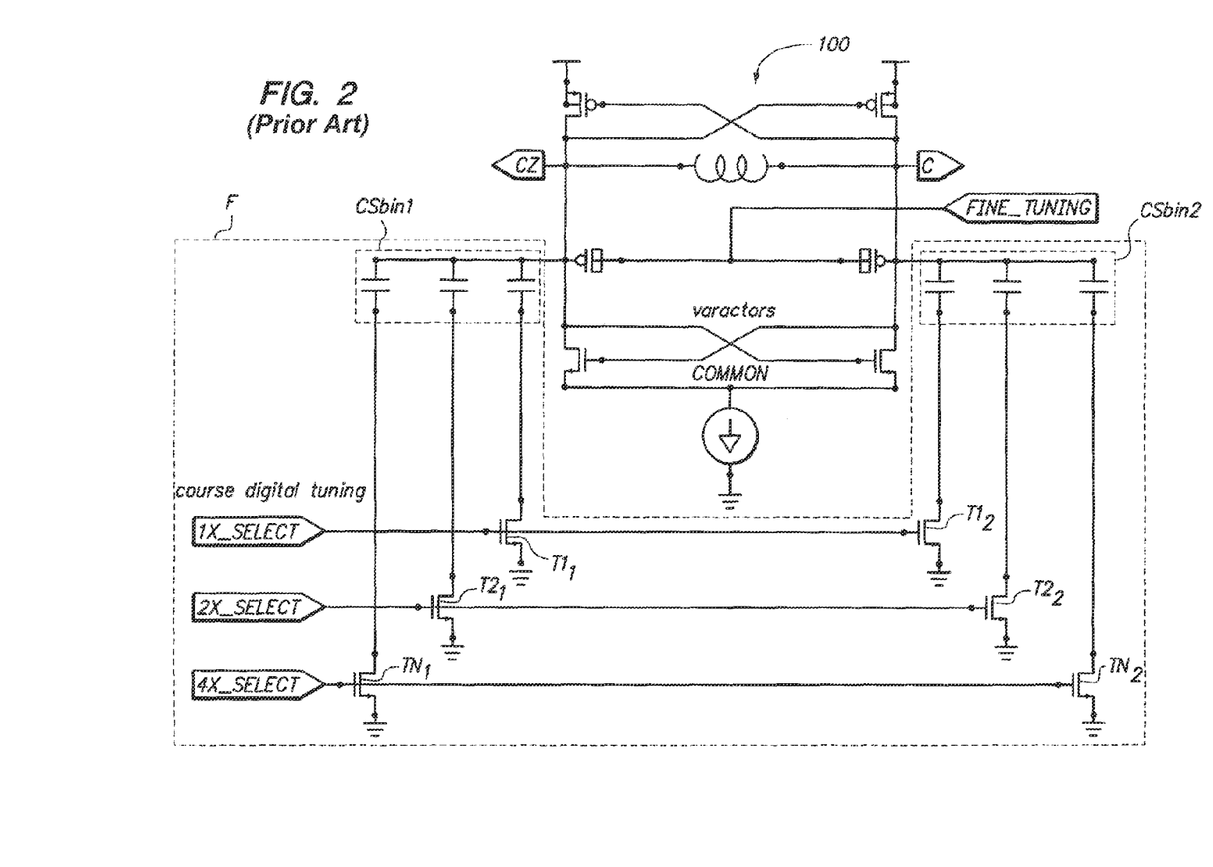
FIG. 2 is a circuit diagram of another prior art VCO, wherein the outlined portion (section F) corresponds to section F of FIG. 5.

FIG. 2 shows a typical complementary LC tuned VCO with a digital, "coarse" tuning port which divides the band into a series of sub-bands, and an analog, "fine" tuning port which functions as the tuning port for a PLL. In this case, since the PLL only operates in a sub-band, the tuning gain is reduced to the sub-band width divided by the supply.

Figure 3:
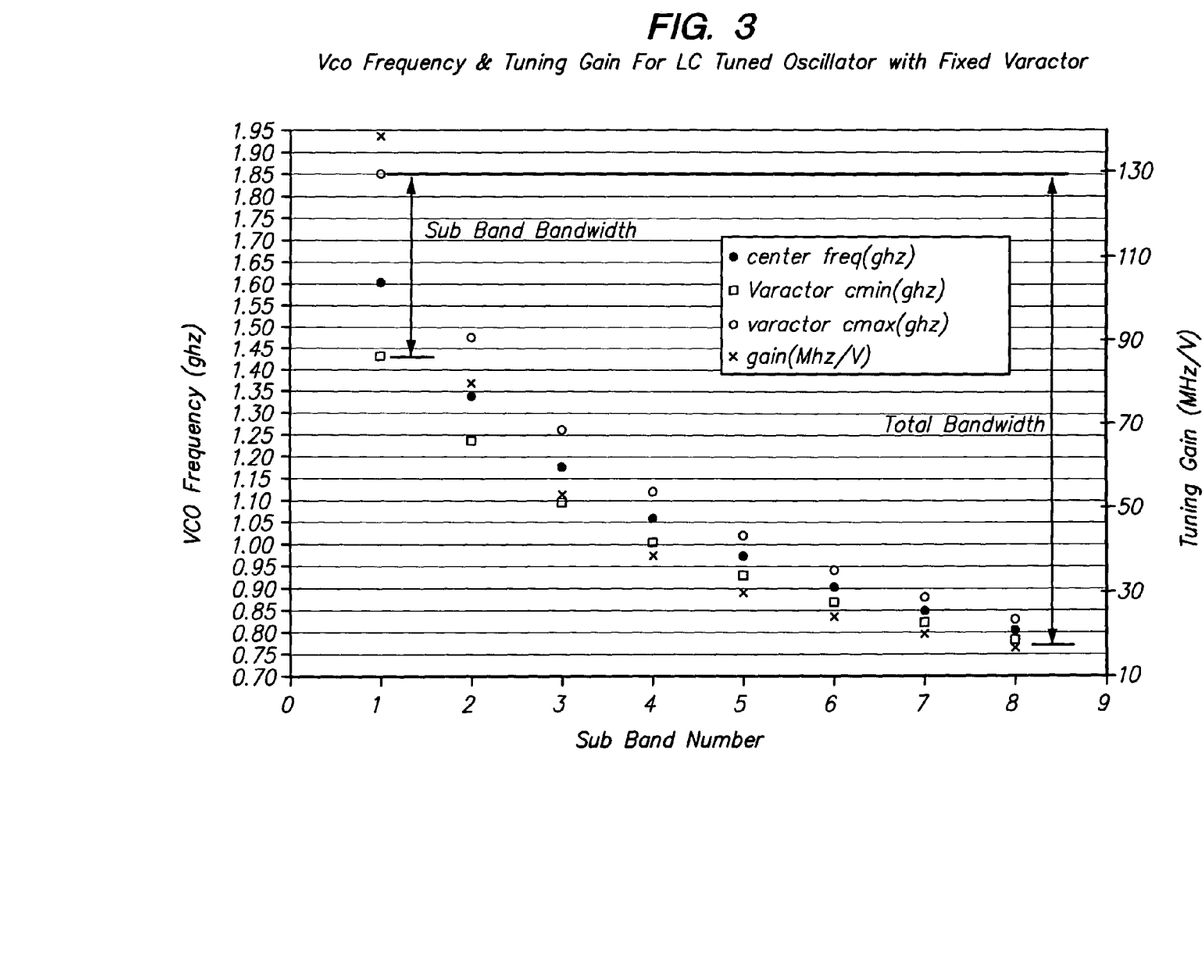
FIG. 3 is graph illustrating characteristics of the VCO of FIG. 2.

FIG. 3 shows the frequency breakdown of the prior art VCO of FIG. 2 for the case of eight sub-bands. Note that:

1. Each coarse selected sub-band must overlap, with fixed varactor. Since all frequencies of the total band must be achievable, there can be no gaps from one selected band to the next, implying each sub-band must have overlap.

2. The amount of overlap depends on the number of sub-bands and on process/temperature/voltage variation. If a selected frequency is near the top or bottom of any sub-band, the sub-band overlap must be sufficient such that the tuning voltage can maintain the desired frequency.

3. Operation in sub-band overlap typically causes charge pump to operate outside optimum output tuning voltage for lowest spurs (i.e., near either rail) due to finite output resistance of the devices.

4. Each coarse tuned sub-band progressively compresses as frequency decreases, with fixed varactor. FIG. 3 shows the band width for each sub-band using a fixed varactor. The right hand scale shows the tuning gain plotted at each sub-band assuming 3V operation. Note that the gain varies by almost an order of magnitude.

5. Sub-band compression forces higher frequency sub-bands to have higher tuning gain, since a minimum gain must be used when designing a PLL loop. As a consequence, there will be only one sub-band with optimum gain.

6. Tuning gain is proportionally dependent on center frequency. That is, as the desired frequency increases, the tuning gain increases at approximately the same rate, as shown in FIG. 3.

Although not illustrated in FIG. 3, the VCO of FIG. 2 experiences amplitude loss across the range. VCO amplitude decreases at lower frequency sub-bands due to increased capacitive loading of the fixed drive amplifier. The amplitude is inversely proportional to load, and proportional to frequency. Automatic amplitude control (AAC) can be used at the cost of increased die area and increased noise, especially within the loop bandwidth of the control circuit. An alternative to AAC is to program the current source when programming frequency. In both the AAC case and the programming case, the use of a current source contributes significant noise to the VCO through channel noise of the source, and the 2x fundamental located at the common node. In order to keep channel noise low, the current source transistors are typically very large, adding to die area.

SUMMARY OF THE INVENTION

The present invention, generally speaking, provides for a programmable, wideband VCO that has all major variables independent of each other such that it can be configured for any frequency/condition at optimum performance. A number of coarse tuning bits is provided sufficient to achieve continuous center frequency selection, independent of other programming parameters. Programmable varactors are used to achieve tuning gain independent of center frequency. This measure allows tuning gain to be kept at the optimum value regardless of selected center frequency. Programmable transconductance (gm) stages are used to achieve amplitude independent of VDD and center frequency over the total band. This measure allows tuning gm to be kept at the optimum value regardless of selected center frequency. The current source characteristic of the prior art is eliminated, removing two major sources of VCO noise and reducing die area. An integrated active supply filter reduces power supply induced noise.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 5:
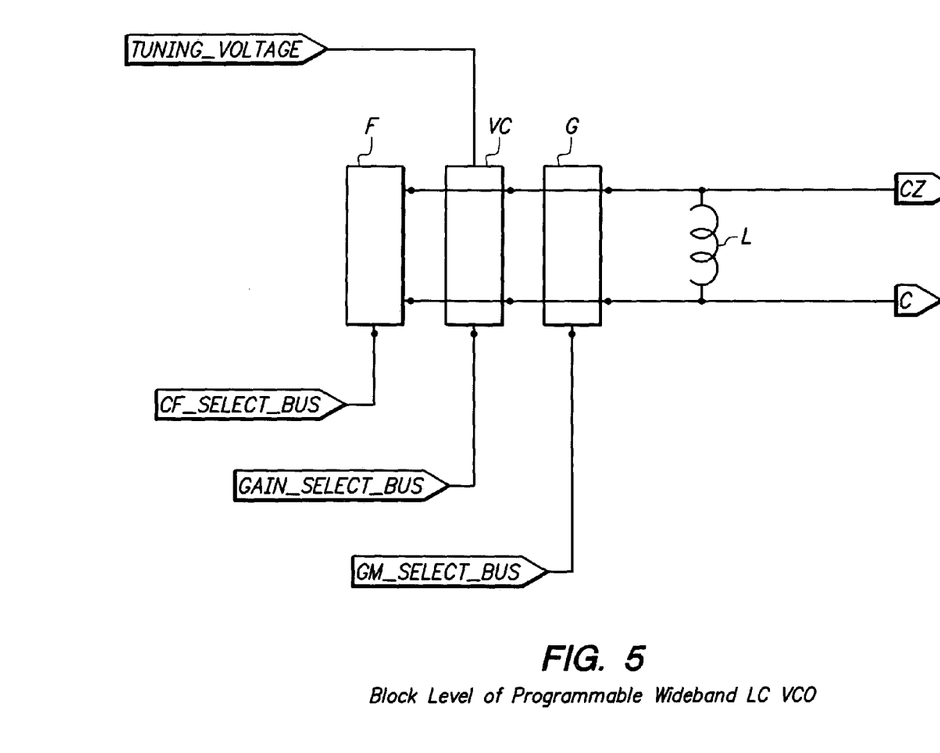
FIG. 5 is a circuit diagram of a VCO in accordance with one embodiment of the invention.

FIG. 5 shows a block level schematic of the programmable, wideband VCO. Each stage independently controls the frequency, tuning gain, and Gm of the VCO without significantly affecting the other.

More particularly, a coarse frequency select stage F, a tuning gain control stage VC, and a variable transconductance output stage G (which includes circuitry like that of the oscillator 100 of FIG. 1) are all connected to the output terminals C, CZ. Each of the stages has an associated control bus (GM_SELECT BUS, FINE_FREQ_SELECT_BUS and VCO_GAIN_SELECT_BUS, respectively.) The voltage control stage VC has a TUNING_VOLTAGE input signal.

The frequency select stage F consists of binary weighted capacitors that are switched into the tank through NMOS switches. Coarse frequency control can be achieved in conventional fashion as depicted in FIG. 2. As shown therein, a first series of binary weighted capacitors Csbin1 is formed with one plate of each capacitor being connected to one side of the oscillator configuration 100. The other plate of the capacitors is connected through a controllable transistor switch ($T1_1$, $T2_1$, etc.) to ground. A second, complementary, series of binary weighted capacitors Csbin2 is connected to the other side of the oscillator configuration. Capacitors of the same weight on opposite sides of the oscillator configuration are paired together, and their respective transistor switches are commonly controlled. Hence, a 1X_SELECT input signal, when asserted, couples capacitors of weight 1 into the circuit on each side of the oscillator configuration such that the frequency of oscillation is reduced. A 2X_SELECT input signal, when asserted, couples capacitors of weight 2 into the circuit on each side of the oscillator configuration such that the frequency of oscillation is further reduced, etc.

Figure 6:
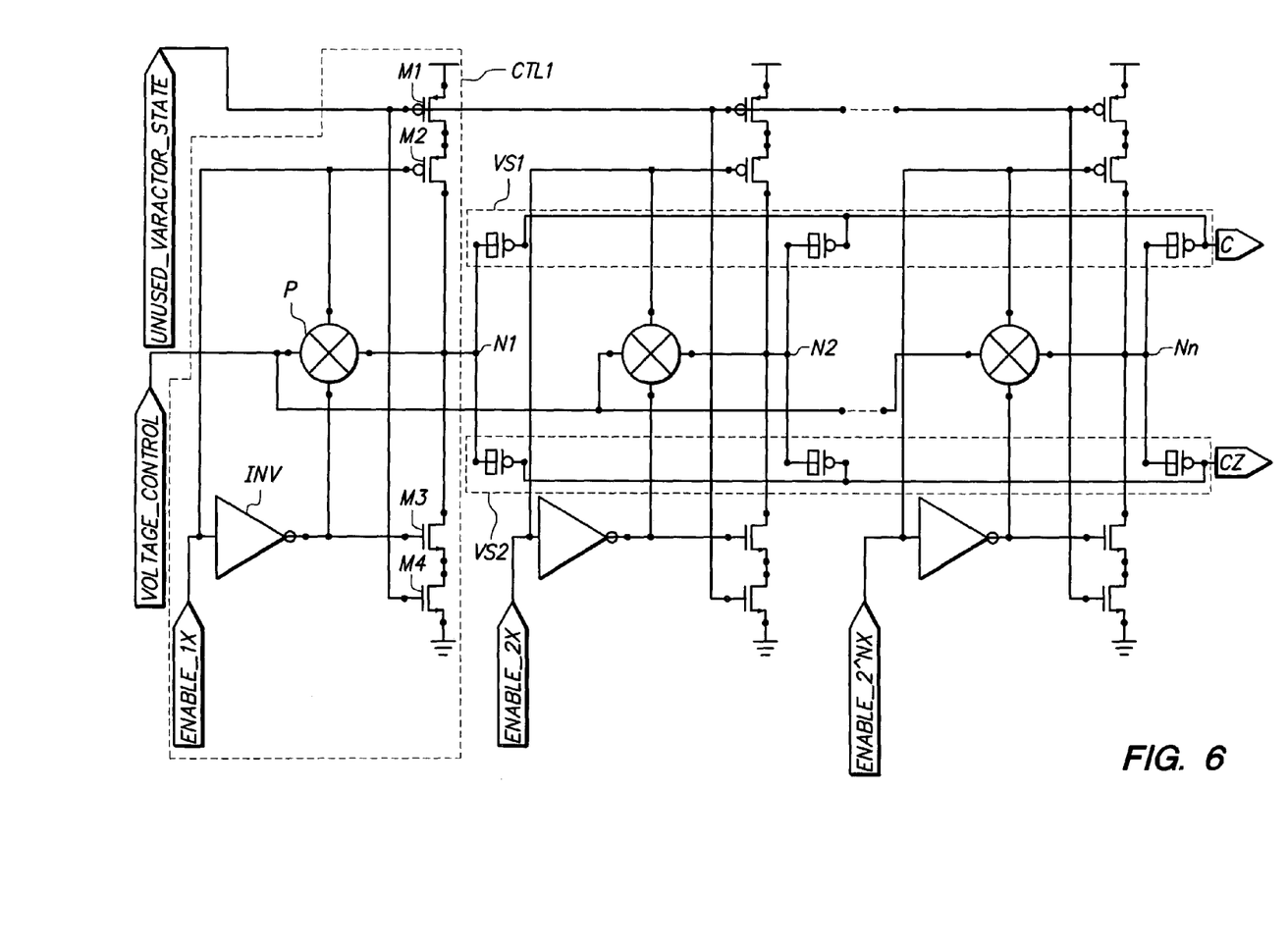
FIG. 6 is a circuit diagram of the VCO tuning stage of FIG. 5.

The voltage control stage consists of binary weighted varactors that are switched either onto the tuning line or to the cmin or cmax state, as depicted in FIG. 6. The cmin/cmax state of unused varactors is determined by the state of the common "unused_varactor_state" bus, which is ground for cmin, and VDD for cmax. The number of cells selected is determined by the gain desired for any given frequency.

More particularly, a series of binary weighted varactors VS1 is formed with one plate of each varactor being connected to one side (C) of the oscillator configuration. The other plate of the respective varactors is connected to respective control voltage nodes N1, N1, etc. A complementary series of binary weighted varactors VS2 is connected to the other side (CZ) of the oscillator configuration. Capacitors of the same weight on opposite sides of the oscillator configuration are paired together, and are commonly controlled. Hence, the state of each varactor pair is determined by a voltage applied to the control voltage node. That voltage may be a supply voltage VDD, a reference voltage VSS, or an intermediate control voltage (VOLTAGE_CONTROL) applied by the user. A circuit CTL1 that determines a voltage applied to the control voltage node N1 will be described.

The control voltage node N1 is connected to VDD through a pair of PMOS transistors M1, M2, to VSS through a pair of NMOS transistors M3, M4, and to a voltage control input signal through a pass gate P. An enable signal ENABLE_1X is applied in its true form to one side of the pass gate and to the PMOS transistor M2. The enable signal is inverted by an inverter INV and is applied in its inverted form to the other side of the pass gate P and to the NMOS transistor M3. When the enable signal is asserted, the pass gate is opened, and the VOLTAGE_CONTROL signal is applied to the control voltage node N1. At the same time, the PMOS transistor M2 and the NMOS transistor M3 are rendered non-conducting.

An UNUSED_VARACTOR_STATE signal is applied to the PMOS transistor M1 and to the NMOS transistor M4. Depending on the value of this signal, one of these two transistors is rendered conducting and the other non-conducting. As a result, when the UNUSED_VARACTOR_STATE signal is low, the voltage VDD is applied to the source of the PMOS transistor M2 while the source of the NMOS transistor M3 remains floating. When the UNUSED_VARACTOR_STATE signal is high, the voltage VSS is applied to the source of the NMOS transistor M3 while the drain of the NMOS transistor M2 remains floating. When the enable signal is deasserted, the voltage determined by the UNUSED_VARACTOR_STATE signal is applied to the control voltage node.

Note that UNUSED_VARACTOR_STATE signal is connected in common to all of the varactor pairs. Similarly, the VOLTAGE_CONTROL signal is connected in common to all of the varactor pairs. Hence, if a varactor pair is enabled, it will be controlled by the VOLTAGE_CONTROL signal. If a varactor pair is not enabled, it, along with any and all other varactor pairs not enabled, will be set to either a minimum capacitance state or a maximum capacitance state depending on the UNUSED_VARACTOR_STATE signal.

The voltage control stage may be programmed to achieve a desired tuning voltage gain independent of the chosen frequency of operation (i.e., independent of the address number of the fine frequency adjust stage). To illustrate, the frequency of operation is given by the following equation:

$$F+dF=1/(2\pi(L*(C+dC))^{1/2}) \qquad (2)$$

If it is desired to keep dF constant for any frequency (F), then setting dF equal to a constant and solving for dC will provide an equation modeling the desired behavior of the tuning voltage gain stage.

Substituting $\frac{1}{2}\pi(LC)^2$ for F to give only two variables:

$$F=1/(2\pi(L*C)^{1/2}) \qquad (3)$$

$$F+dF=1/(2\pi(L*(C+dC)2\pi) \qquad (4)$$

$$(F+dF)^2=1/4\pi^2*L*(C+dC) \qquad (5)$$

$$C+dC=1/4\pi^2*L*(F+dF)^2 \qquad (6)$$

Substituting (3) into (6):

$$C+dC=1/(4\pi^2*L*(\tfrac{1}{2}\pi(L*C)^{1/2}+dF)^2)) \qquad (7)$$

$$dC=1/(4\pi^2*L*(\tfrac{1}{2}\pi(L*C)^{1/2}+dF)^2)-C \qquad (8)$$

Eq. (8), gives the required dC (delta C) as a function of L, C, and dF.

Since dF is set to a constant, and L is constant for this discussion, dC is a function of C (frequency).

Notice that (4) provides F as a function of C, and dF as an independent function of dC. Since dC is now programmable (variable) by means of the tuning voltage gain stage, C determines the frequency, F, and dC determines the tuning voltage gain, dF, in an independent manner.

F is determined by the programmable capacitor switches which, with enough bits, gives fine digital control of center frequency. dF is determined by the programmable varactor switches, which gives continuous analog control of the frequency, ie, tuning gain.

Figure 4:
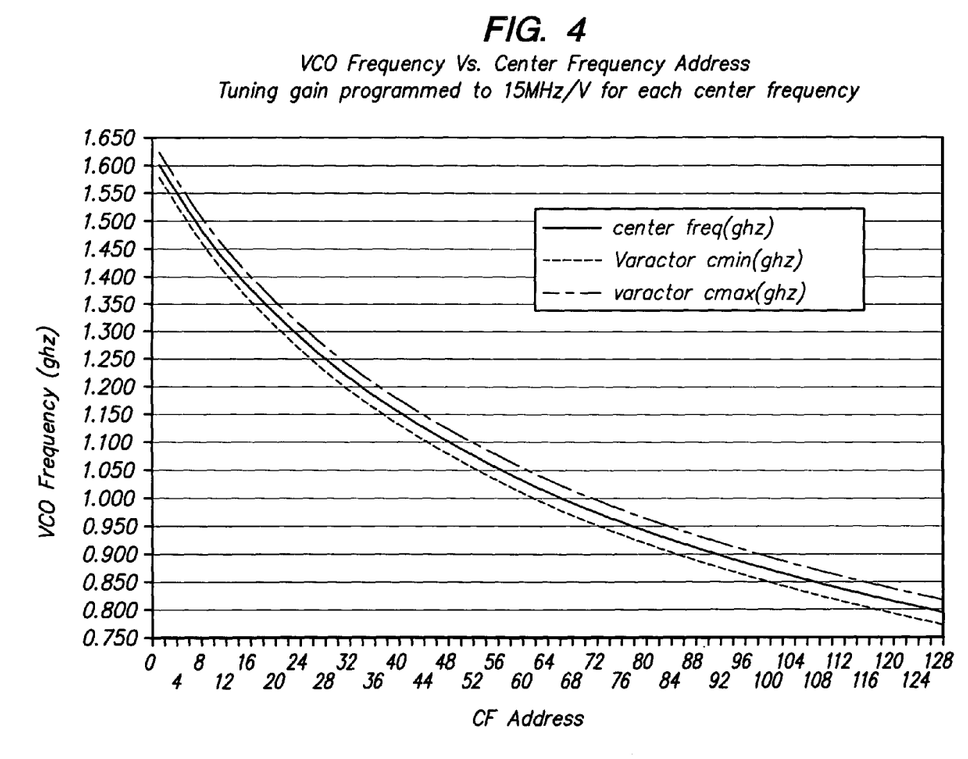
FIG. 4 is a graph illustrating characteristics of the VCO of FIG. 5.

FIG. 4 shows center frequency selection vs. 128 addresses (7 bits). It also shows cmin and cmax of the varactor using 15 MHz/V programmed gain for each address. The cmin/cmax ratio, when programmed, must be low enough to obtain the tuning voltage gain at the high end of the band, and high enough to obtain the desired tuning voltage gain at the low end of the band.

Figure 7:
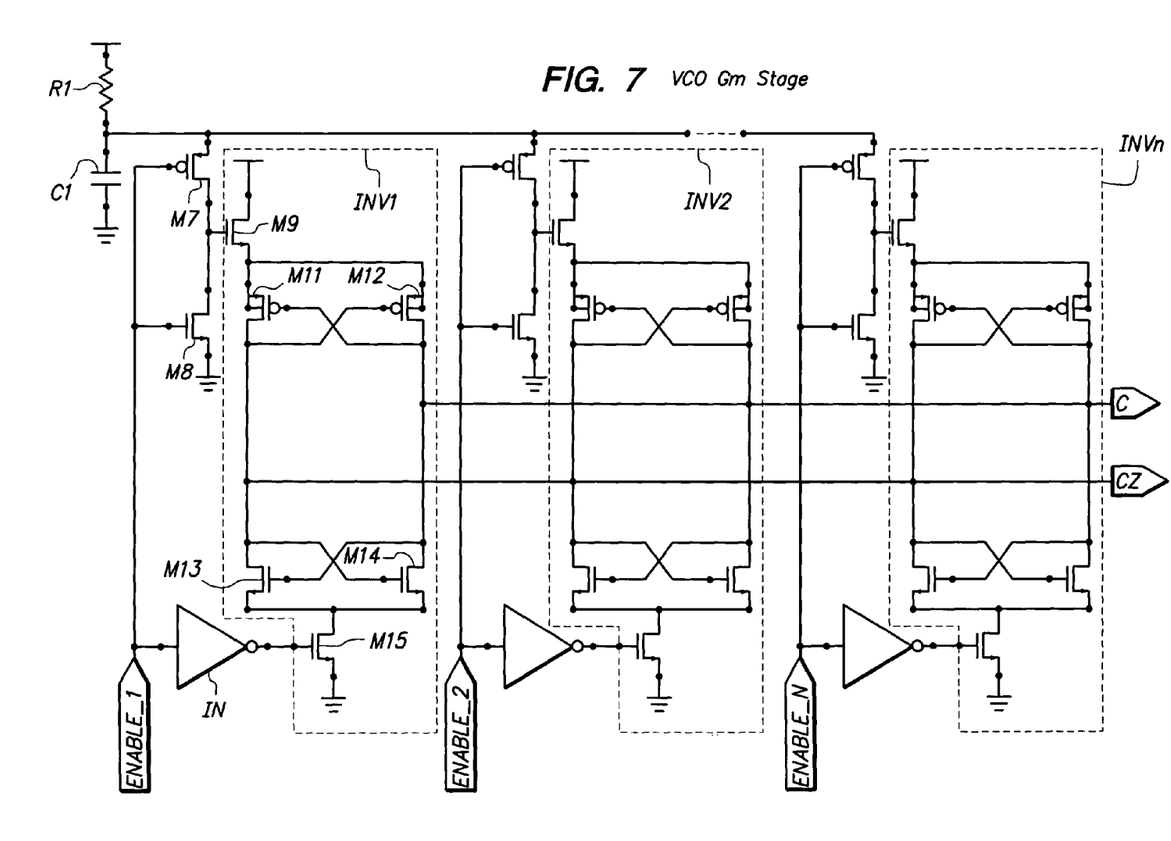
FIG. 7 is a circuit diagram of the VCO transconductance stage of FIG. 5.

The Gm stage is consists of N selectable complementary cross coupled CMOS inverters used to offset resistive losses found in the LC tank, and is depicted in FIG. 7. The inverters, if operating at the right power (gm setting in this case), deliver a sinusoidal waveform. The number of individual Gm cells is determined by the total bandwidth and tank loss of the VCO.

When any cell is selected, the cross coupled NMOS devices are pulled to ground by the select NMOS, and the cross coupled PMOS devices are pulled to a intermediate voltage created by the active filter R1, C1, M9. This filter isolates supply noise from the VCO. When deselected, the cross coupled transistors are left connected to the tank, but with no path to either rail, which consequently has little affect on the selected frequency, since the device parasitics are not removed from the tank. The number of stages selected to be active is determined by performance criteria, such as noise or power, and start-up requirements, due to the load. In this case, there is no binary weighting.

More particularly, the inverter stages INV1, INV2, etc. are connected in common with CZ as the input signal and C as the output signal. Separate enable signals ENABLE_1, ENABLE_2, etc. are provided for each inverter and determine whether a particular inverter will be connected or will be disconnected (floating). Taking as an example the first inverter INV1, the inverter itself is formed by PMOS transistors M11, M12 and NMOS transistors M13, M14 connected in the same manner as previously described in relation to the oscillator 100 of FIG. 1. The voltage VDD is applied through a PMOS transistor M9 to the sources of the PMOS transistors M11 and M12. A voltage VSS (ground) is applied through an NMOS transistor M15 to the sources of the NMOS transistors M13, M14. An enable signal ENABLE_1 is applied to a PMOS transistor M7 and an NMOS transistor M8 connected to form an inverter, an output signal of which is connected to the gate of the transistor M9. The enable signal is also inverted by an inverter IN and is applied in its inverted form to the NMOS transistor M15. When the enable signal is asserted, the NMOS transistor M9 and the NMOS transistor M15 are both caused to conduct, thereby connecting the inverter INV1 to its supply voltages. When the enable signal is deasserted, both transistors are rendered non-conducting, removing the supply voltages from the inverter INV1.

As described in the foregoing description, a VCO, preferably wideband VCO, is provided that achieves independent control of critical VCO parameters including center frequency, tuning voltage gain and output drive strength (Gm). Incorporation of the VCO into PLLs or other systems is simplified in that operation of the VCO is readily optimized to achieve system design goals.

It will be appreciated by those of ordinary skill in the art that the invention can be embodied in other specific forms without departing from the spirit or essential character thereof. The foregoing description is therefore intended in all respects to be illustrative and not restrictive. The scope of the invention is indicated by the appended claims rather than the foregoing description, and all changes that come within the meaning and range of equivalents thereof are intended to be embraced therein.

What is claimed is:

1. A method of programming a voltage controlled oscillator having programmable parameters including at least two of the following: center frequency, voltage tuning gain, and output stage drive strength; the method comprising the steps of:
    determining a first programming value for a first one of said parameters; and
    determining a second programming value for a second one of said parameters in view of the first programming value;
    wherein the first one of said parameters is center frequency and the second one of said parameters is voltage tuning gain, the voltage tuning gain determining how much an output frequency of the voltage controlled oscillator changes in response to changes in an analog tuning voltage, and wherein the center frequency is substantially unaffected by programming of the voltage tuning gain.

2. A method of programming a voltage controlled oscillator having programmable parameters including at least two of the following: center frequency, voltage tuning gain, and output stage drive strength; the method comprising the steps of:
    determining a first programming value for a first one of said parameters; and
    determining a second programming value for a second one of said parameters in view of the first programming value;
    wherein the first one of said parameters is center frequency and the second one of said parameters is output stage drive strength.

3. A method of programming a voltage controlled oscillator having programmable parameters including at least center frequency and voltage tuning gain, the voltage tuning gain determining how much an output frequency of the voltage controlled oscillator changes in response to changes in an analog tuning voltage, the method comprising the steps of:
    determining a first programming value for center frequency; and
    determining a second programming value for voltage tuning gain taking into account the first programming value;
    wherein the first programming value and the second programming value together result in a voltage tuning gain of substantially a predetermined value, and wherein the center frequency is substantially unaffected by programming of the voltage tuning gain.

4. A voltage controlled oscillator comprising:
    an oscillator;
    a fine frequency select stage coupled to the oscillator and controlled in accordance with a digital address word applied thereto; and
    a voltage tuning stage coupled to the fine frequency select stage and comprising a tuning voltage input and at least one linear array of varactors, each varactor having a plurality of states including a state in which it exhibits a variable reactance that varies as a continuous function of an analog voltage applied thereto via the tuning voltage input and a state in which it is unaffected by the analog voltage.

5. The apparatus of claim 4, wherein the voltage tuning stage is controlled in accordance with a digital address word applied thereto.

6. The apparatus of claim 5, wherein the voltage tuning stage is controlled in accordance with a max/min selection signal applied thereto.

7. The apparatus of claim 6, wherein the voltage tuning stage is controlled in accordance with a voltage tuning signal applied thereto.

8. The apparatus of claim 7, wherein, for a particular varactor of the linear array of varactors, if a corresponding bit of the digital address word applied to the voltage tuning stage is asserted, the particular varactor is controlled in accordance with the voltage tuning signal.

9. The apparatus of claim 7, wherein, for a particular varactor of the linear array of varactors, if a corresponding bit of the digital address word applied to the voltage tuning stage is de-asserted, the particular varactor is set to either a maximum capacitance state or a minimum capacitance state in accordance with the max/min signal.

10. The apparatus of claim 9, wherein each varactor for which a corresponding bit of the digital address word applied to the voltage tuning stage is de-asserted is set to a same one of the following states: a minimum capacitance state and a maximum capacitance state.

11. The apparatus of claim 4, further comprising a variable drive strength output stage coupled to the oscillator.

12. The apparatus of claim 11, wherein the variable drive strength output stage (Gm) is controlled in accordance with a digital address word applied thereto.

13. A voltage tuning stage for use with a voltage controlled oscillator, the voltage tuning stage comprising:
   a tuning voltage input;
   at least one linear array of varactors, each varactor having a state in which it exhibits a variable reactance that varies as a continuous function of an analog voltage applied thereto via the tuning voltage input; and
   inputs for receiving a digital address word, the voltage tuning stage being controlled in accordance with a digital address word applied thereto to determine which varactors are placed in said state;
   wherein varactors not placed in said state are unaffected by the analog voltage.

14. The apparatus of claim 13, wherein the voltage tuning stage is further controlled in accordance with a max/min selection signal applied thereto.

15. The apparatus of claim 14, wherein the voltage tuning stage is further controlled in accordance with a voltage tuning signal applied thereto.

16. The apparatus of claim 15, wherein, for a particular varactor of the linear array of varactors, if a corresponding bit of the digital address word applied to the voltage tuning stage is asserted, the particular varactor is controlled in accordance with the voltage tuning signal.

17. The apparatus of claim 16, wherein, for a particular varactor of the linear array of varactors, if a corresponding bit of the digital address word applied to the voltage tuning stage is de-asserted, the particular varactor is set to either a maximum capacitance state or a minimum capacitance state in accordance with the max/min signal.

18. The apparatus of claim 17, wherein each varactor for which a corresponding bit of the digital address word applied to the voltage tuning stage is de-asserted is set to a same one of the following states: a minimum capacitance state and a maximum capacitance state.

* * * * *